(12) United States Patent
Strang et al.

(10) Patent No.: US 7,311,782 B2
(45) Date of Patent: *Dec. 25, 2007

(54) APPARATUS FOR ACTIVE TEMPERATURE CONTROL OF SUSCEPTORS

(75) Inventors: Eric J. Strang, Chandler, AZ (US); Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/103,542

(22) Filed: Apr. 12, 2005

(65) Prior Publication Data

US 2005/0178335 A1 Aug. 18, 2005

Related U.S. Application Data

(63) Continuation of application No. 10/630,783, filed on Jul. 31, 2003, now Pat. No. 6,949,722, which is a continuation-in-part of application No. PCT/US02/03403, filed on Feb. 25, 2002.

(60) Provisional application No. 60/272,453, filed on Mar. 2, 2001.

(51) Int. Cl.
*C23C 16/00* (2006.01)
*H01L 21/00* (2006.01)

(52) U.S. Cl. .................. 118/724; 118/725; 156/345.52; 156/345.53

(58) Field of Classification Search ................ 118/724, 118/725, 728, 729, 500; 156/345.52, 345.53; 206/832; 414/416.04
See application file for complete search history.

(56) References Cited

U.S. PATENT DOCUMENTS

| | | | |
|---|---|---|---|
| 4,546,613 A | 10/1985 | Eacobacci et al. | |
| 5,290,381 A * | 3/1994 | Nozawa et al. | 156/345.27 |
| 5,382,311 A * | 1/1995 | Ishikawa et al. | 156/345.54 |
| 5,458,687 A * | 10/1995 | Shichida et al. | 118/724 |
| 5,484,011 A * | 1/1996 | Tepman et al. | 165/80.2 |
| 5,605,048 A | 2/1997 | Kozlov et al. | |
| 5,616,264 A | 4/1997 | Nishi et al. | |
| 5,740,016 A | 4/1998 | Dhindsa | |
| 5,811,762 A | 9/1998 | Tseng | |
| 5,834,068 A | 11/1998 | Chern et al. | |
| 6,001,183 A * | 12/1999 | Gurary et al. | 118/720 |
| 6,032,724 A | 3/2000 | Hatta | |
| 6,033,478 A | 3/2000 | Kholodenko | |
| 6,059,986 A | 5/2000 | Jung et al. | |
| 6,353,209 B1 | 3/2002 | Schaper et al. | |
| 6,492,621 B2 | 12/2002 | Ratliff et al. | |
| 6,493,086 B1 | 12/2002 | McAndrew et al. | |
| 6,502,529 B2 | 1/2003 | Herchen | |
| 6,530,994 B1 | 3/2003 | Mahawili | |
| 6,531,681 B1 | 3/2003 | Markle et al. | |
| 6,740,853 B1 | 5/2004 | Johnson et al. | |
| 6,780,374 B2 | 8/2004 | Weaver et al. | |

* cited by examiner

*Primary Examiner*—Sylvia R. MacArthur
(74) *Attorney, Agent, or Firm*—Oblon, Spivak, McClelland, Maier & Neustadt, P.C.

(57) ABSTRACT

A method and an apparatus utilized for thermal processing of substrates during semiconductor manufacturing. The method includes heating the substrate to a predetermined temperature using a heating assembly, cooling the substrate to the predetermined temperature using a cooling assembly located such that a thermal conductance region is provided between the heating and cooling assemblies, and adjusting a thermal conductance of the thermal conductance region to aid in heating and cooling of the substrate. The apparatus includes a heating assembly, a cooling assembly located such that a thermal conductance region is provided between the heating and cooling assemblies, and a structure or configuration for adjusting a thermal conductance of the thermal conductance region.

7 Claims, 10 Drawing Sheets

APPARATUS FOR ACTIVE TEMPERATURE CONTROL OF SUSCEPTORS

CROSS-REFERENCE TO RELATED APPLICATIONS

This application is a continuation of U.S. application Ser. No. 10/630,783, filed Jul. 31, 2003, now U.S. Pat. No. 6,949,722 which is a continuation-in-part of PCT/USO2/03403, filed Feb. 25, 2002, which claims priority to U.S. application Ser. No. 60/272,453, filed Mar. 2, 2001, the entire contents of which are incorporated herein by reference. This application claims priority under 35 U.S.C. § 120 for U.S. application Ser. No. 10/630,783, filed Jul. 31, 2003; PCT/USO2/03403, filed Feb. 25, 2002; and U.S. application Ser. No. 60/272,453, filed Mar. 2, 2001.

BACKGROUND OF THE INVENTION

1. Field of the Invention

The present invention relates generally to thermal processing of substrates during semiconductor manufacturing.

2. Discussion of the Background

The increasing sophistication of semiconductor technology, and the never ending reduction in minimum line widths, is causing process engineers to demand increasing capabilities from the equipment used to manufacture semiconductor integrated circuits. These requirements are leading in particular to a need to minimize the cumulative thermal burden of integrated circuit processes. The thermal burden is the cumulative amount of heat (in degree-minutes) absorbed by a wafer during processing.

Sources of the thermal burden include diffusion furnaces, etch and deposition processes, rapid thermal processing and annealing steps, among others. Typically, the temperature of a wafer rises during a process step to a steady state temperature, remains at that steady state temperature for a predetermined amount of time, then drops back to room temperature. Each process step thus adds to the thermal burden of the overall process. Though the peak temperature of a given process step usually contributes the most to the incremental increase in the thermal burden, the need for processes requiring lower peak temperatures is causing temperature ramp steps to contribute substantially to the thermal burden in an increasing number of cases. In some cases, there is essentially no steady state temperature. One key piece of equipment used to control the temperature of a wafer during a process step is a susceptor. Each wafer is placed sequentially on a susceptor, and the temperature of the wafer is controlled through the susceptor.

Minimizing the thermal burden in general, and precise wafer temperature control in particular, presents challenges to the manufacturers of capital equipment used to make integrated circuits. Those equipment manufacturers that can best meet the needs of the end users of semiconductor capital equipment stand to increase their market share.

SUMMARY OF THE INVENTION

The inventors of the present invention have identified important issues and problems associated with wafer processing that are addressed by the present invention. For example, the inventors have determined that in order to reduce the thermal burden on the semiconductor wafer during processing it is advantageous to provide for rapid temperature control of the wafer by heating and cooling in order to stabilize the wafer at one or more predetermined temperatures during processing. Simply heating and cooling the wafer by controlling the temperature of a heat transfer solution and then circulating that solution through channels formed in a wafer support structure will not provide optimal results. This method suffers from the amount of time and energy required to change the heat transfer solution from one temperature to another. The inventors have determined that what is needed is a way to allow both heating and cooling control of a wafer.

The diffusion of dopant atoms in a semiconductor structure is a process that is exploited to produce desired device structures. Diffusion is a thermodynamic process, so relatively high temperatures are used to achieve a desired profile in a reasonable time. However, the same profiles can be obtained at lower temperatures provided that such temperatures are maintained for longer periods of time. The cumulative effect of thermal processes during semiconductor integrated circuit manufacturing steps can have the same effect as processes that utilize high temperatures. Unfortunately, the cumulative thermal burden of a process can cause excessive diffusion. Two contributing factors to the thermal burden of a process are the time required to heat a wafer and the time required to cool the wafer. The inventors have identified advantages in rapidly switching the temperature of a heat source so that a wafer temperature can be set to a desired temperature and changed to a different temperature during a single process.

The inventors have determined that the wafers need to be heated or cooled uniformly from a uniform initial temperature profile to a desired temperature. However, existing systems, such as flash lamp-based heaters, inject more heat into the middle of the wafer than into the radial portions of the wafer, which results in non-uniform heating. Compounding this problem is the insulating effect of air around the periphery of the wafer that impedes heat flow into and out of the wafer. Thus, the inventors have determined that what is needed is a way to provide for a uniform thermal conductance.

The rate at which a heating or cooling structure can transfer heat into or out of a wafer becomes important as soon as a change in the temperature of a wafer is required. Existing systems rely on pure conductance, which is a function of the materials used to form the structure. Alternative structures rely on conductance supplemented by circulating heat exchange fluids. However, such systems are limited by the capacity of the structure to transfer heat into and out of the fluid. Although such systems are capable of transferring huge quantities of heat, those systems do so with the assistance of large volumes of heat exchanging equipment. In semiconductor manufacturing environments, space, and in particular floor space, is expensive, so there is an incentive to avoid bulky heating and cooling systems. Instead, attention is focused on improving the performance of systems confined to existing spaces. The inventors have determined that what is needed is a way to enhance the thermal conductance of a heating or cooling structure.

The periphery of a wafer changes temperature at a different rate than does the bulk of the wafer. This difference can lead to an edge effect that can adversely affect device performance. Accordingly, the inventors have determined that what is needed is a way to spatially vary the thermal conductance of a structure used to heat or cool wafers.

The inventors have further determined that it is important to temporally vary the thermal conductance of a structure used to heat or cool wafers. The inventors have determined that it is desirable to have a very high thermal conductance when the wafer is at a temperature significantly different from the desired temperature so that one can transfer a lot of heat into or out of a wafer so that the wafer reaches a desired temperature as quickly as possible. However, when the wafer is at or close to a desired temperature, it is advantageous to have a low thermal conductance.

The presence of a temperature sensor (e.g., thermocouple) can provide accurate measurements of the temperature at the sensory location. In some instances, such sensors are used to determine whether a valve should be opened or closed, thereby controlling the amount of coolant allowed to flow and the amount of energy being dissipated. However, thermocouples only provide temperature measurements at the location of the thermocouple. In addition, thermocouples break due to thermal cycling, and require electrical connections, including electrical insulation, between the thermocouple and their associated instrumentation. Furthermore, in a system that provides for enhanced rates of heating and cooling, the adverse effects of thermal cycling are exacerbated. Accordingly, the inventors have determined that what is needed is a way to sense the temperature so that the controller can adjust the valve and heater appropriately.

In an effort to address the important issues identified by the inventors and discussed above, the inventors have constructed an apparatus and method as described in detail below. Accordingly, the present invention advantageously provides an apparatus and method for reducing thermal burden on a wafer during processing.

The present invention advantageously provides a method including the steps of heating the wafer to a predetermined temperature when needed using a heating assembly, cooling the wafer to the predetermined temperature when needed using a cooling assembly located such that a thermal conductance region is provided between the heating assembly and the cooling assembly, and adjusting a thermal conductance of the thermal conductance region to aid in heating and cooling of the wafer. The method preferably heats the wafer by utilizing an electrical resistive element attached to a heating body adapted to support the wafer, and preferably cools the wafer by feeding a cooling fluid along a fluid path within the cooling assembly.

A preferred embodiment of the method of the present invention adjusts the thermal conductance of the thermal conductance region by providing a body within the thermal conductance region. The body includes a recess configured to define at least a portion of a chamber that receives a working fluid. The pressure or density of working fluid present within the chamber can then be adjusted. The adjustment of the pressure or density of the working fluid present within the chamber preferably includes (1) evacuating the working fluid from the chamber during the step of heating the wafer and (2) injecting the working fluid within the chamber during the step of cooling the wafer. Alternatively, the step of adjusting the pressure or density of working fluid present within the chamber includes (1) injecting a first working fluid within the chamber during the step of heating the wafer and (2) injecting a second working fluid within the chamber during the step of cooling the wafer.

In one embodiment of the present invention, the body includes a recess with a membrane therein. That membrane enables separate working fluids to be provided and adjusts within each of the separate sections of the chamber. In another embodiment, the body includes a recess that has a side wall and a base. The side wall abuts the heating assembly such that the heating assembly, the side wall, and the base define the chamber. The base is spaced apart from the heating assembly by a gap distance that varies over the base.

An alternate embodiment of the method of the present invention includes the step of adjusting the thermal conductance of the thermal conductance region by adjusting a spatial relationship between the heating assembly and the cooling assembly.

The present invention further advantageously provides a thermal processing apparatus including a heating assembly, a cooling assembly located such that a thermal conductance region is provided between the heating assembly and the cooling assembly, and a device configured to adjust a thermal conductance of the thermal conductance region. The heating assembly preferably includes a heating body adapted to support the wafer and an electrical resistive element attached to the heating body. The cooling assembly preferably includes a cooling body, a fluid path within the cooling body, and a feed device configured to feed cooling fluid along the fluid path.

A preferred embodiment of the apparatus of the present invention includes (1) a device with a body having a recess configured to define at least a portion of a chamber configured to receive a working fluid, and (2) a fluid injection system configured to inject a working fluid within the chamber. The device preferably further includes a control system configured to control the fluid injection system to achieve a predetermined density or a predetermined pressure of working fluid within the chamber. The device preferably further includes a pressure regulator, where the control system is configured to control the pressure regulator. The injection system preferably includes a gas supply configured to inject helium gas within the chamber as the working fluid, and alternatively an additional gas supply configured to inject a second gas within the chamber as the working fluid. The device preferably further includes a vacuum pump configured to evacuate the chamber.

The recess preferably has an aperture abutting the heating assembly to define the chamber. The recess preferably has a platinum coating and a membrane therein defining separate sections within the chamber. The membrane is in a form of a honeycomb, or alternatively in the form of ribs. The recess preferably has a side wall and a base, where the side wall abuts the heating assembly such that the heating assembly, the side wall, and the base define the chamber. The base is spaced apart from the heating assembly by a gap distance that varies over the base.

The preferred embodiment is also defined such that the heating assembly and the cooling assembly are mounted on a pedestal having plural conduits, the first conduit extending therethrough is configured to receive power supply wires for the electrical resistive element. The second conduit is configured to act as a supply line for the fluid path. The third conduit is configured to act as a discharge line for the fluid path, and the fourth conduit is configured to act as a feed line for the chamber.

An alternate embodiment of the apparatus of the present invention is defined such that the device includes a driving device configured to adjust a distance between the heating assembly and the cooling assembly.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DESCRIPTION OF THE PREFERRED EMBODIMENTS

The present invention will now be described with reference to preferred embodiments illustrated in the figures. The present invention generally relates to a method and an apparatus for actively controlling the temperature of a susceptor. The apparatus supports a wafer with a heating assembly, beneath which is a thermal conductance region whose thermal conductance is regulated. Furthermore, a cooling assembly is provided beneath the thermal conductance region. The present invention further includes several methods of operating the apparatus.

Figure 1:
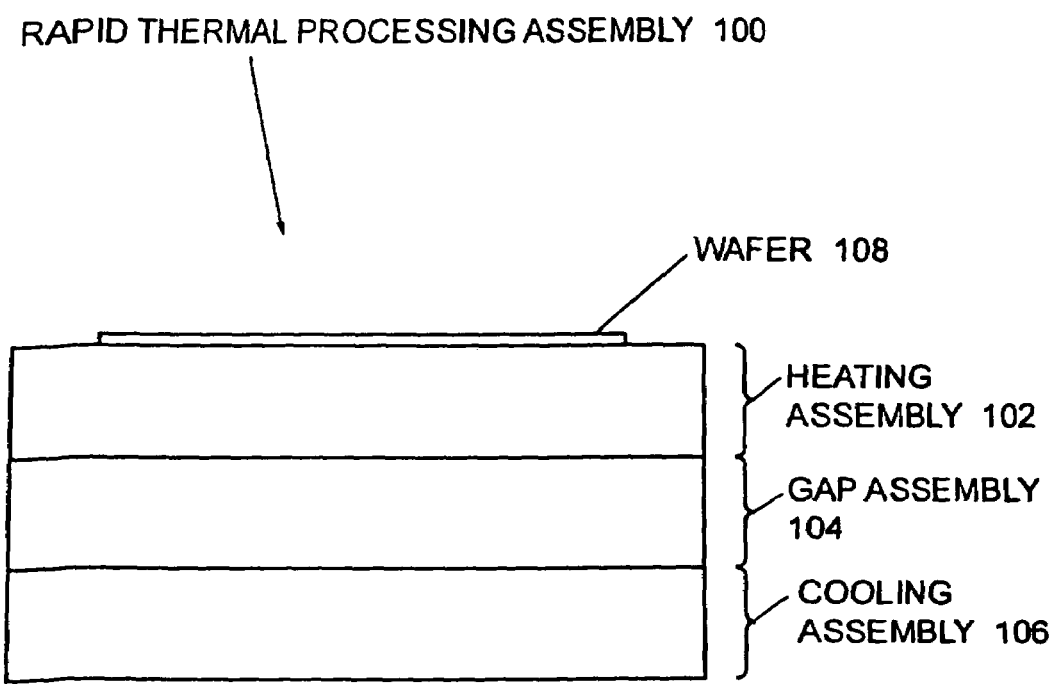
FIG. 1 is a schematic representation of a rapid thermal processing assembly according to an embodiment of the present invention.

Referring now to the drawings, FIG. 1 is an overview of a preferred embodiment of a rapid thermal processing assembly or apparatus 100, which acts essentially as, for example, a novel thermal switch for heating and cooling susceptors used for processing semiconductor wafers. The apparatus 100 generally includes a heating assembly 102, a cooling assembly 106, and a gap assembly or device 104 provided within a thermal conductance region between the heating assembly 102 and the cooling assembly 106. The gap assembly 104 is configured to adjust a thermal conductance of the thermal conductance region, as will be described in further detail below. A substrate 108 (e.g., a semiconductor wafer or an LCD panel) is placed on top of the uppermost surface of the processing assembly 100. More generally, the substrate is a workpiece (1) with one surface that is substantially flat, and (2) that is preferably the same size or smaller than the processing assembly 100.

The heating assembly 102 is used to increase the temperature of the substrate 108 to a desired temperature, for example, during initialization of the manufacturing process in order to preheat the substrate 108 for processing. The cooling assembly 106 is used to lower the temperature of substrate 108 as desired during the manufacturing process. The heating assembly 102 and the cooling assembly 106 allow the temperature level to be increased or decreased as required during the manufacturing process. The gap assembly 104 is substantially aligned with and may either be fixedly or separately connected to the cooling assembly 106. The uppermost surface may be a heating assembly 102 as shown in FIG. 1, or the order of the heating assembly 106 may be switched such that the cooling assembly 106 is the uppermost surface. When, for example, one is utilizing the assembly 100 for a "spike" anneal (i.e., rapid heat-up to a temperature and rapid cool-down), it is preferable to have the heating element located proximate the substrate. One reason for such a design is that the heating element can be fabricated with less thermal inertia than the cooling element. Furthermore, the primary cooling mechanism at the elevated temperatures is, at least initially, radiative transport (this provides some time to compensate for the cooling element thermal lag).

Additional elements, described in detail below, serve to change the thermal conductance of gap assembly 104 as needed to ensure that the substrate 108 changes rapidly in temperature to a desired predetermined temperature. Note that the location of the gap assembly 104 in between the heating assembly 102 and the cooling assembly 106 allows the gap assembly 104 to either insulate the substrate 108 from the cooling assembly 106, or facilitate thermal transfer from the cooling assembly 106 to the substrate 108. Similarly, the gap assembly 104 can either insulate the substrate 108 from the heating assembly 102, or facilitate thermal transfer from the heating assembly 102 to the substrate 108.

The heating assembly 102 is connectable to the gap assembly 104. The gap assembly 104 is connectable to the cooling assembly 106. The substrate 108 is removably connected to the heating assembly 102, for example, by a chuck assembly such as an electrostatic chuck manufactured by Tokyo Electron Limited, or the one disclosed in U.S. Pat. No. 5,310,453 entitled "Plasma process method using an electrostatic chuck" and assigned to Tokyo Electron Yamanashi Limited (Fukasawa et al.). In operation, the heating assembly 102 is used to raise the temperature of substrate 108 to a desired temperature, and the cooling assembly 106 is used to reduce the temperature of substrate 108 to a desired temperature. However, the effectiveness of the cooling assembly 106 to control the temperature of the substrate 108 depends on the thermal conductivity of the gap assembly 104, due to the presence of the gap assembly 104 in between the substrate 108 and the cooling assembly 106. Therefore, to enhance the rate at which the substrate 108 can be heated, the gap assembly 104 is adjusted to reduce the rate of heat transfer across the gap assembly 104 (i.e., lower the thermal conductivity of the gap assembly 104). Likewise, when rapid cooling of the substrate 108 is required, the thermal conductance of gap assembly 104 is adjusted to enhance the rate of heat transfer across the gap assembly 104 (i.e., the thermal conductivity of the gap assembly 104 is increased).

Figure 2:
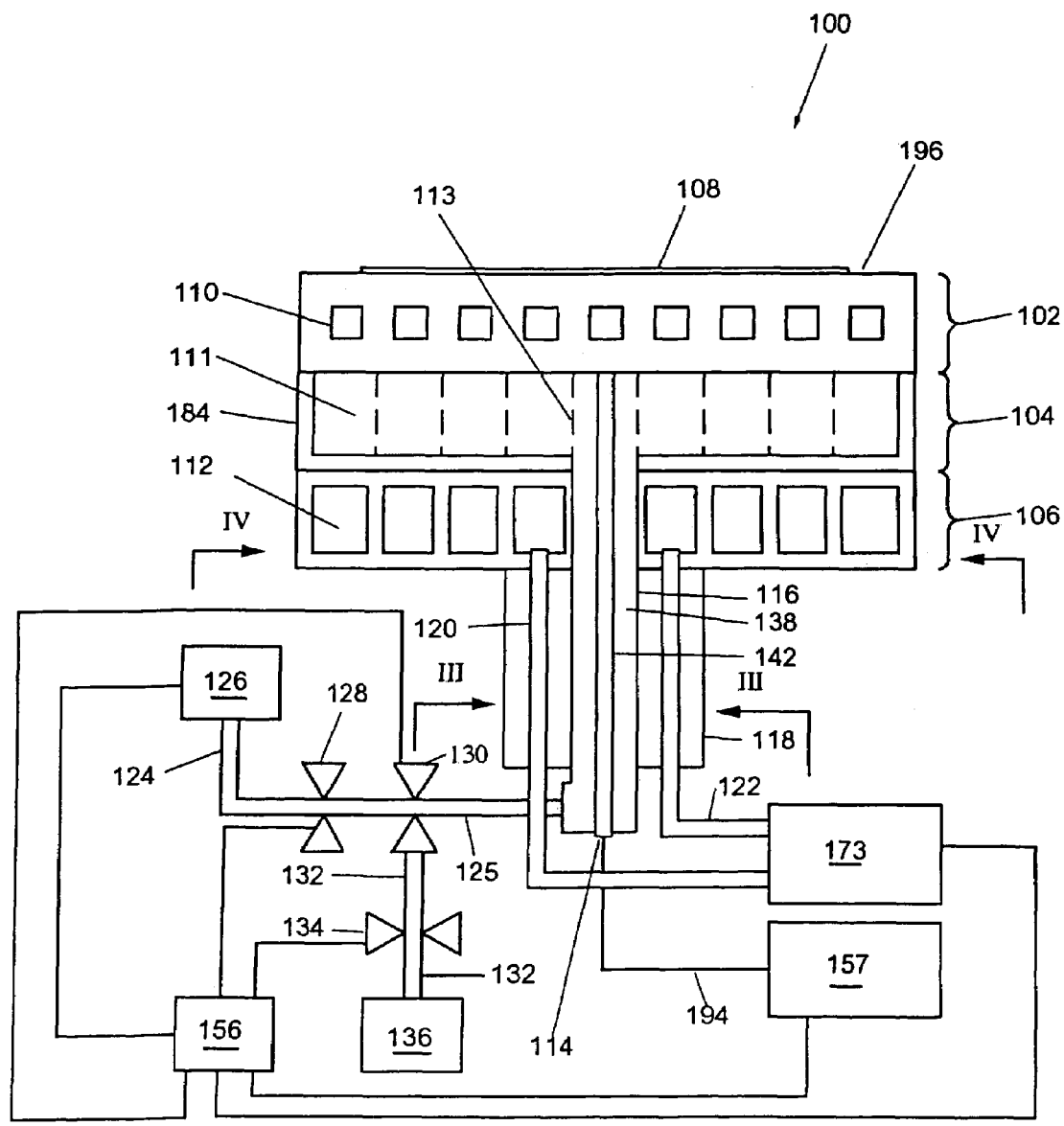
FIG. 2 is a detailed representation of a rapid thermal processing assembly according to an embodiment of the present invention.

FIG. 2 is a detailed view of the rapid thermal processing assembly or apparatus 100. The apparatus 100 preferably includes a heating assembly 102, a gap assembly or device 104, a cooling assembly 106, a helium gas supply 136, a first valve 128, a second valve 130, a vacuum pump 126, a pressure regulator 134, a cooling channel feed 120, a cooling channel return 122, a pedestal 118, a vacuum feed 138, a first vacuum line 124, a gas line 132, a controller 156, an electrical wire feed through 114, a second vacuum line 125, a membrane 113, heater wires 194, and a power supply 157. The interrelationship of the elements of the apparatus 100 is depicted in FIG. 2, and is explained in detail below.

The heating assembly 102 includes a heating body 196 and at least one electrical resistive element 110 attached to the heating body 196, for example, by embedding the elements 110 within the body 196. The heating body 196 is preferably formed from quartz, although the body 196 can alternatively be made from materials, such as sapphire and alumina, or aluminum as in the electrostatic chuck manufactured by Tokyo Electron Limited, or the one disclosed in U.S. Pat. No. 5,310,453 entitled "Plasma process method using an electrostatic chuck" and assigned to Tokyo Electron Yamanashi Limited (Fukasawa et al.). Still alternatively, the heating body may be formed of carbon, silicon carbide, silicon nitride, or any other material known to be used for forming a heating assembly. It is to be understood that any one or more of these known materials for forming a heating assembly may be used in combination with the present invention without deviating from the spirit and scope of the present invention.

The electrical resistive element 110 is preferably made of Kanthal™, although alternatively the element 110 can be made of materials such as Nikrothal, tungsten, etc. The advantage of using Kanthal™ to form the electrical resistive element 10 is its high resistivity. However, the coefficient of thermal expansion of Kanthal™ is an order of magnitude larger than that of quartz, which means that the heating assembly should be made to include space for the Kanthal™ to expand within the quartz enclosure. For further details, an exemplary design and fabrication of the heating assembly 102 is described in International Application No. PCT/US00/25503 filed on Sep. 28, 2000 (based upon U.S. Ser. No. 60/156,595).

The controller 156 preferably includes a microprocessor, such as a Pentium® processor, memory for data and process recipe storage, and a data bus for transferring data to and from the memory. The controller 156 is electrically connected to and configured to control the operation of the vacuum pump 126, the first valve 128, the second valve 130, the pressure regulator 134, the power supply 157, and the coolant fluid supply and pump 173. Such electrical connections will be readily apparent to one of ordinary skill in the art.

Figure 3:
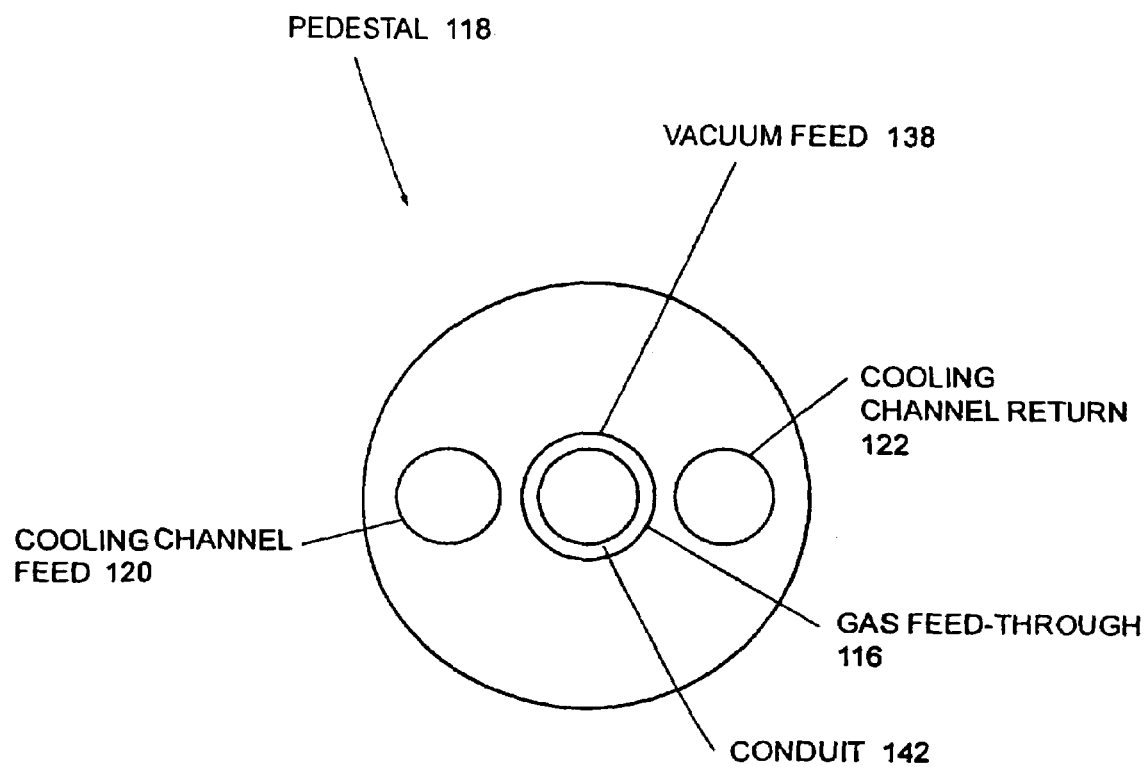
FIG. 3 is a cross-sectional view of an embodiment of a pedestal taken along lines III-III in FIG. 2.

With reference to FIG. 3, the pedestal 118 is preferably made of quartz or other similar material, for example alumina or sapphire. The pedestal 118 has a lower first end, and an upper second end. The second end is positioned opposite to the first end and is connected to the cooling assembly 106. The pedestal 118 is preferably cylindrical in shape, although other shapes can alternatively be utilized. The cooling channel feed 120 and cooling channel return 122 are formed within the pedestal 118, for example, by milling through-passages from the first end of pedestal 118 to the second end of pedestal 118 along axes parallel to, but displaced from, a principal or central axis of the cylindrical pedestal. The cooling channel feed 120 and cooling channel return 122 are formed so that the cooling channel feed 120 and the cooling channel return 122 are arranged on opposite sides of the principle axis of the pedestal 118, with gas feed line 116 positioned therebetween. The gas feed line 116 extends coaxially with the principle axis of the pedestal 118. The diameter of pedestal 118 is sufficiently large such that the cooling channel feed 120, the cooling channel return 122, and the gas feed line 116 can be formed therein without compromising the structural integrity of pedestal 118, and without overlapping.

The vacuum feed 138 is provided within the gas feed line 116, which is formed in the pedestal 118, for example, by standard milling methods, and includes a lower first end and an upper second end. The lower first end of the vacuum feed 138 is fixedly attached to a sealing cap to ensure that neither gas nor vacuum can escape from vacuum feed 138. The second end of vacuum feed 138 is open, and exposed to gap recess 111 (see FIG. 2). The vacuum feed 138 is formed along the principal axis of the pedestal 118.

As depicted in FIG. 2, the electrical wire feed through 114 is fixedly attached to the conduit 142, which is a hollow cylinder passing through the length of the vacuum feed 138, and along the principal axis of the pedestal 118. The wire feed through 114 forms a vacuum seal with the vacuum feed 138 so that there is no leak. The electrical wire feed through 114 passes through the lower first end of vacuum feed 138. The conduit 142 is parallel to and coincident to the principal axis of the pedestal 118, and is sufficiently large that electrical connections to resistive elements 110 pass freely through the conduit 142.

Figure 4:
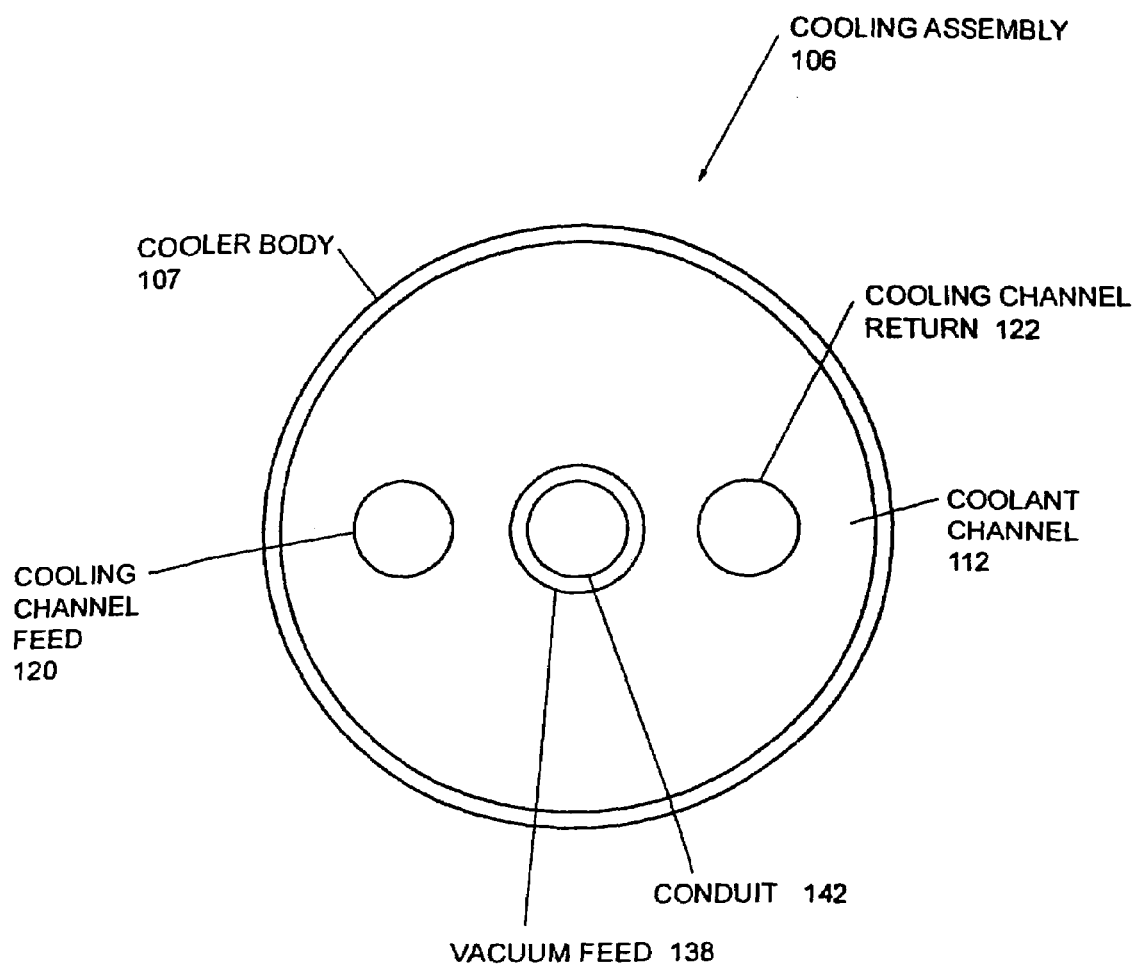
FIG. 4 is a cross-sectional view of an embodiment of a cooling assembly taken along lines IV-IV in FIG. 2.

With reference to FIGS. 2 and 4, the cooling assembly 106 is fixedly attached to the pedestal 118, and includes a cooling body 107 and a coolant channel or fluid path 112. The cooling assembly 106 is preferably made out of the same materials as the pedestal 118, although other similar materials can alternatively be utilized. For example, the cooling assembly 106 may be made from materials, such as sapphire and alumina, aluminum, carbon, silicon carbide, silicon nitride, or any other material known to be used for forming a cooling assembly. It is to be understood that any one or more of these known materials for forming a cooling assembly may be used in combination with the present invention without deviating from the spirit and scope of the present invention.

The coolant channel 112 preferably follows a serpentine path designed to allow uniform cooling across an upper surface of the cooling assembly 106 to which gap assembly 104 is attached. Alternative coolant channel 112 configurations will be readily apparent to one of ordinary skill in the art. The coolant channel 112 has a first end fluidly connected to the cooling channel feed 120, and a second end fluidly connected to the cooling channel return 122.

FIG. 4 is a cross-sectional view along lines IV-IV in FIG. 2 that depicts the coolant channel 112, the cooling channel return 122, the cooling channel feed 120, conduit 142, and the vacuum feed 138. The coolant channel 112 is formed in the cooling body 107 using standard techniques and is configured to provide a fluid path for cooling fluid traveling therethrough.

Figure 5:
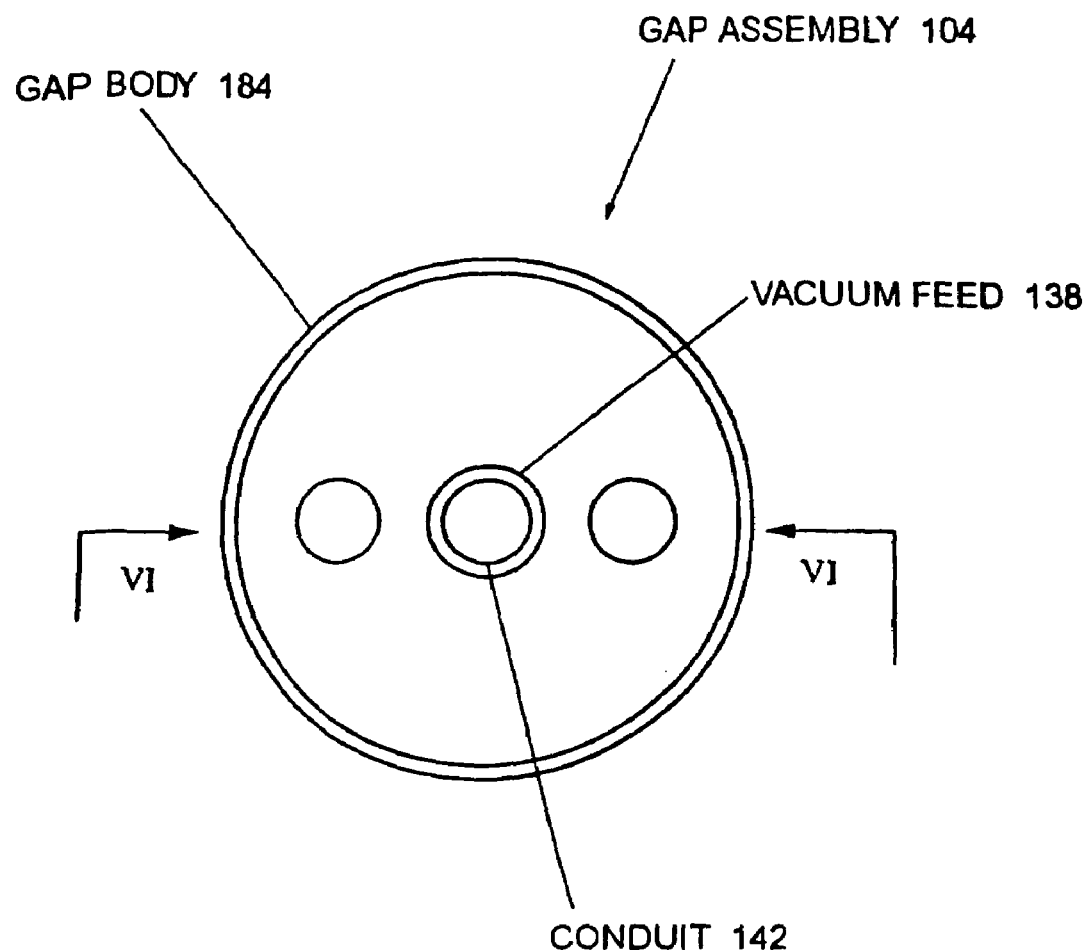
FIG. 5 is a plan view of a gap assembly according to an embodiment of the present invention.
Figure 6:
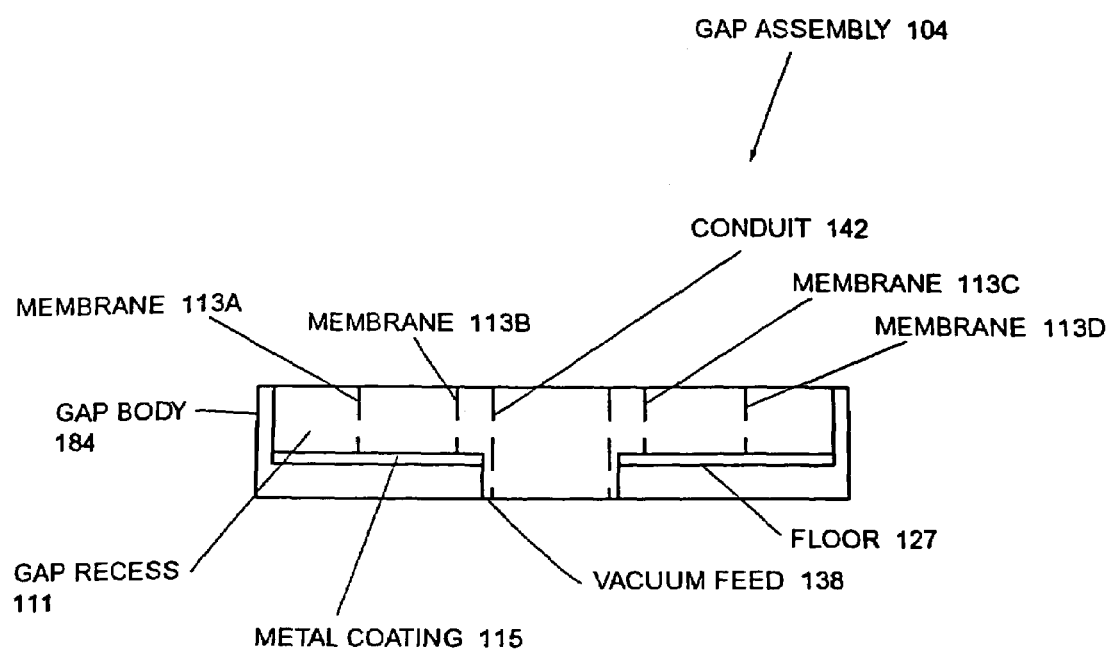
FIG. 6 is a cross-sectional view of the gap assembly taken along lines VI-VI in FIG. 5.

With reference to FIGS. 2, 5 and 6, the gap assembly or device 104 occupying a thermal conductance region includes a gap body 184 with a gap recess 111. The gap assembly 104 is preferably made out of the same materials as the pedestal 118, although other similar materials can alternatively be used. FIG. 5 is a plan view of the gap assembly 104 that includes the gap body 184, the vacuum feed 138, and the conduit 142. The gap recess 111 and the lower surface of the heating body 196 define a chamber configured to receive a working fluid as described in detail below. For convenience of construction, the gap body 184, the vacuum feed 138 and the conduit 142 are preferably cylindrical in cross-section, and are coaxially aligned, although other shapes and configurations can alternatively be utilized.

FIG. 6 is a cross-sectional view along lines VI-VI in FIG. 5 of the gap assembly 104, which depicts an optional metal such as, for example, platinum, coating 115, a floor or base 127, the gap recess 111, the vacuum feed 138, and the conduit 142. The interrelation of these elements is depicted in FIG. 6, and described in detail below. The optional metal coating 115 is formed, for example, by sputter depositing a layer approximately 1 μm thick onto the floor 127 of gap body 184. The gap body 184 is preferably formed of quartz or other materials with comparable material properties.

Preferably, a membrane 113 is positioned within the recess 111. The membrane 113 is preferably formed from a quartz honeycomb or even sparsely distributed quartz ribs (see the honeycomb walls/ribs 113A, 113B, 113C, and 113D depicted in FIG. 6) machined into a thick piece of quartz, where the quartz honeycomb or ribs are bonded to a bottom surface of the heating assembly 102 and bonded to the floor 127 of the recess 111 prior to deposition of platinum coating 115 or insertion of a platinum sheet. Due to the viscous nature of the quartz bonding frit, the honeycomb or ribs can be "dipped" into a thin layer of the frit. Thereafter, the solvents can be baked out, the quartz pieces assembled, and the assembled product bonded in a high temperature kiln. The quartz honeycomb or ribs aid in distributing a load applied to a backside of a thin, large diameter quartz heating assembly 102 when the gap is subjected to atmospheric pressure gas (or greater) and an environment external to the processing assembly that is in a vacuum. Conversely, the honeycomb or ribs can be used to support a compressive load when the gap is evacuated and the external ambient environment is at atmospheric pressure.

Referring again to FIG. 2, the power supply 157 provides electrical power to the electrical resistive element 110 via heater wires 194. The power supply 157 thus needs to be able to provide sufficient power, for example power up to 25 kW. The power supply 157 is calibrated experimentally with respect to the electrical resistive element 110 so that any given power output (i.e., current and voltage setting) corresponds to a known thermal output by the electrical resistive element 110, thereby determining the temperature to which the substrate 108 will be heated by the electrical resistive element 110. Alternatively, the power supply 157 is calibrated using a pyrometer. By controlling the temperature based upon a given power output which provides a known thermal output, the present invention has eliminated the need for the use of a thermocouple to detect the temperature of the substrate 108. However, alternatively a temperature sensor could be utilized with the present invention if so desired to precisely measure the temperature level of the substrate 108. Temperature sensors may include a pyrometer located in the structure opposite the substrate (e.g. "viewing" the substrate from above) such as those commercially available through Sekidenko (Model 2000 optical fiber thermometer), an emissometer such as those commercially available from Sekidenko (Model 2100 emissometer), or band-edge temperature measurement such as that described in pending U.S. application 60/174,593 and 60/189,043. The latter device requires optically coupling, via fiber optics, broadband IR radiation to the backside of the substrate and on a substrate side opposite the illumination monitoring the movement (as a function of temperature) of the transmission band-edge. An additional well-known technique to monitor the temperature of the heating element includes measuring the element resistance from the known voltage across the element and the current, and computing the temperature from its known resistivity-temperature dependence. This approach is most useful when the heating element material has a large temperature coefficient for resistivity.

With reference again to FIG. 2, the thermal processing assembly 100 advantageously provides an apparatus that can efficiently heat a wafer during processing or prior to commencement of processing if so desired, for example, in order to preheat a wafer to an optimal temperature prior to or during the processing. In operation, with the substrate 108 on the heating assembly 102 of the rapid thermal processing assembly 100, a command from the controller 156 causes the second valve 130 to be set to vacuum pump, hence closing off line 132, and the first valve 128 to be opened. As a result, any residual gas in the gas feed through 116 and in the gap recess 111 is pumped out. The controller 156 sends a signal to power supply 157 to apply electrical power, at a level corresponding to a desired temperature setting, to the electrical resistive element 110 via heater wires 194.

When a reduction in wafer temperature is desired, the second valve 130 is opened to the gas supply 136 (i.e., second valve 130 is closed to vacuum pump 126) while the first valve 128 to the vacuum pump is closed, and the pressure regulator 134 is set to allow a given amount of working "fluid" (e.g., helium or other similar conductor in either a gaseous or liquid state) to flow through gas line 132 to vacuum line 125, through gas feed through 116, and to gap recess 111. The pressure regulator 134 sets the gas pressure within gap recess 111. The result of the working fluid within the gap recess 111 is a dramatic increase in the thermal conductance of gap assembly 104. Simultaneously, cooling fluid of a predetermined temperature is pumped into cooling channel feed 120, through coolant channel 112 to cool the substrate 108 to the predetermined temperature, and back to the cooler through cooling channel return 122. Even during heating operations, coolant may be pumped through the coolant channels since the heater is thermally (conductively) insulated from the cooler via the gap assembly 104 in a vacuum state. Thus, the simultaneous action of flooding the evacuated gap recess 111 with gas from a helium gas supply 136, along with pumping cooling fluid through coolant channel 112 (and turning off the power applied to electrical resistive elements 110) causes the apparatus to act as a heat switch. Since the height of gap recess 111 is small, the volume associated with the gap recess 111 is also small. Consequently, reversing the above process also causes the apparatus of the present invention to act as a heat switch. Thus, the present invention serves as a bi-directional heat switch.

In an alternate configuration, helium gas supply 136 and pressure regulator 134 are replaced by plural working fluid sources and a pressure regulator for each working fluid source. In operation with this configuration and upon command from controller 156, one working fluid is turned off and another working fluid is turned on. As a result, the working fluid in gap recess 111 changes from one working with one conductance during heating (low thermal conductance) to another working fluid with a different conductance during cooling (high thermal conductance).

In yet another alternate configuration, the gas feed through 116 is divided into two or more passageways with one end of each passage way fluidly connected to a separate pressure regulator and source of gas, and the other end of each passage way fluidly connected to different sections of the gap recess 111, where the different sections of the gap recess 111 are separated by membrane 113. In this configuration, each section of the gap recess 111 can have a different thermal conductance, thereby allowing spatially variable heating and cooling.

Figure 7:
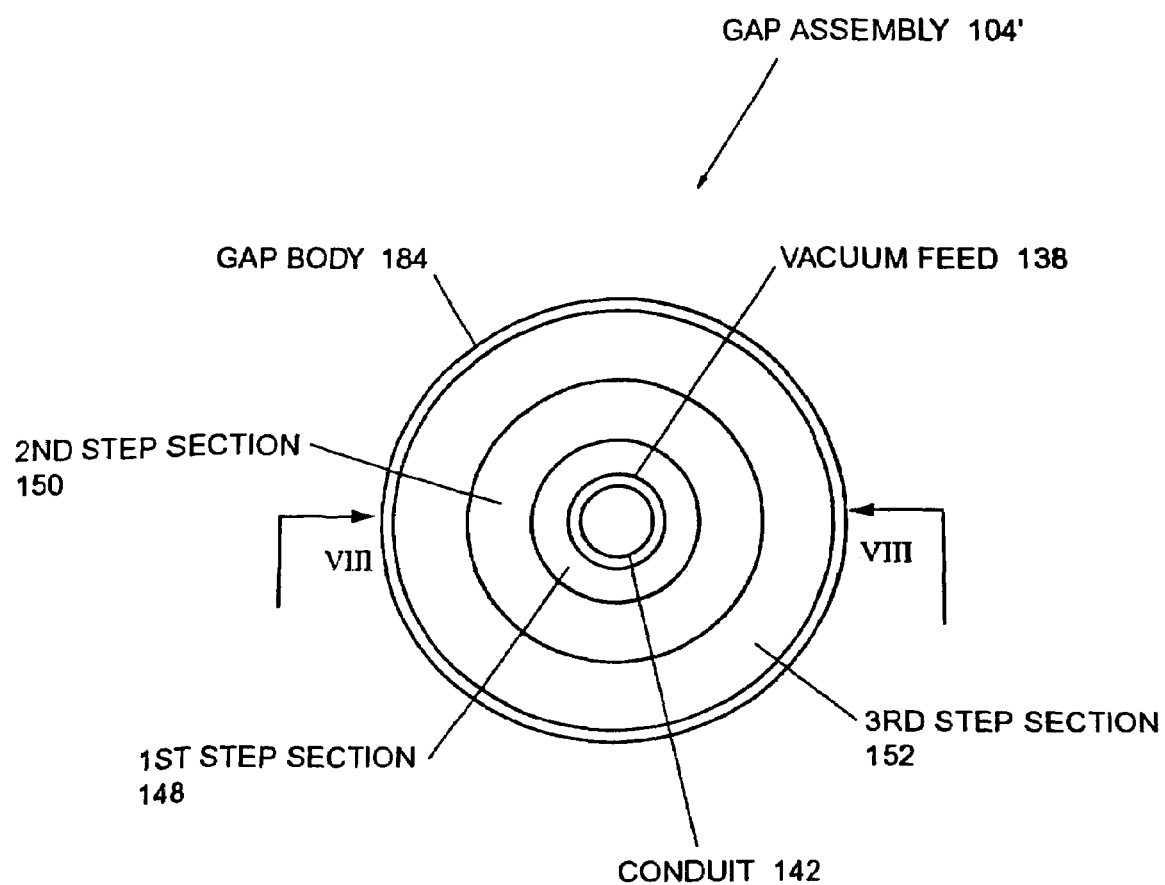
FIG. 7 is a plan view of a gap assembly according to an alternative embodiment of the present invention.
Figure 8:
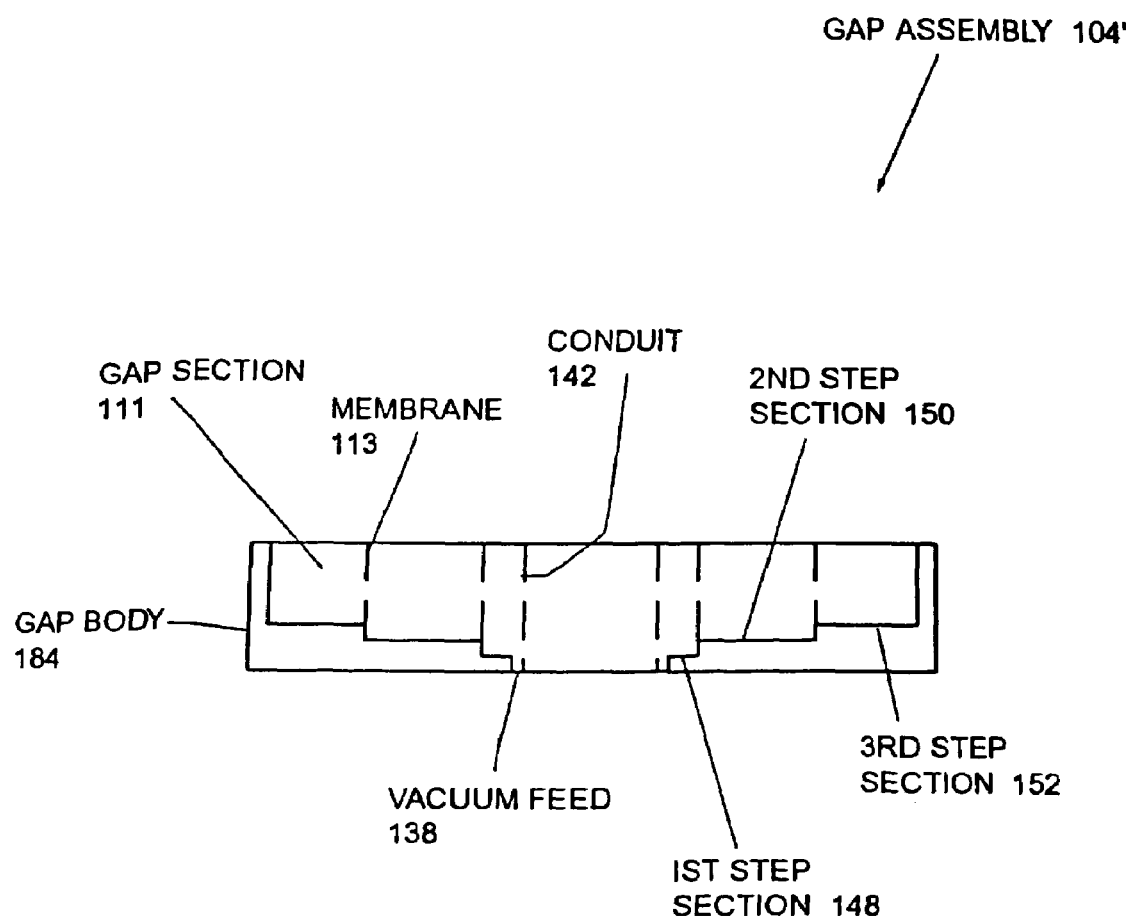
FIG. 8 is a cross-sectional view of the gap assembly taken along lines VIII-VIII in FIG. 7.

FIGS. 7 and 8 depict an alternative embodiment of the gap assembly 104', where the gap body 184 is provided with an alternative configuration. FIG. 7 is a plan view of an alternate embodiment of the gap assembly 104' that includes a first step section 148, a second step section 150, and a third step section 152. FIG. 8 is cross-sectional view taken along line VIII-VIII of the alternate embodiment of the gap assembly 104' that includes the gap section 111, the vacuum feed 138, and conduit 142. The first step section 148, the second step section 150, and the third step section 152 are annular portions of floor. The step sections are arranged such that the height (or distance between the upper surface of the step section and the top of the gap assembly 104') of the gap recess 111 varies spatially from section to section. By varying the gap recess height, the thermal conductance of the gap can also be varied.

In operation, this embodiment operates exactly the same as the first embodiment, except that the presence of first step section 148, second step section 150, and third step section 152 causes a spatial variation in the conductance of the gap according to the height of the gap recess 111 above each step. It should be clear to those skilled in the art that the annular arrangement of steps is but one possible configuration of step heights, and that many other arrangements are possible. The step heights can vary in ways other than as shown in FIG. 8. For example, it may be advantageous to reverse the sequence of step heights from low to high to a sequence of high to low. Moreover, the gap thickness in FIG. 8 is depicted as being stepped, but it may alternatively be smoothly varying, for example, by making the floor a convex and/or concave surface.

It should be further noted that an additional alternative embodiment of the present invention is configured such that the locations of the heating 102 and the cooling assembly 106 are switched. In this configuration the cooling assembly supports the substrate 108 and the heating assembly is located below the gap assembly. Thus, the cooling assembly may be an electrostatic chuck manufactured by Tokyo Electron Limited, or the one disclosed in U.S. Pat. No. 5,310,453 entitled "Plasma process method using an electrostatic chuck" and assigned to Tokyo Electron Yamanashi Limited (Fukasawa et al.), or U.S. Patent Application Ser. No. 60/156,595, filed Sep. 29, 1999 and International Application No. PCT/US00/25503, filed Sep. 18, 2000 incorporated herein by reference. In such a configuration, the cooling channel feed 120 and/or the cooling channel return 122 of FIG. 1 are utilized to carry the heater wires 194 from the power supply 157 to the electrical resistive element 110. Additionally, the conduit 142 of FIG. 1 is split or sectioned into or provided as two parallel tubes, where one tube acts as the cooling channel feed and the other tube acts as the cooling channel return, thereby supplying working fluid from the coolant fluid supply and pump 173 to the coolant channel 112, and back. Such a configuration will be readily apparent to one of ordinary skill in the art based upon the above disclosure of the various embodiments of the rapid thermal processing assembly 100.

Figure 9:
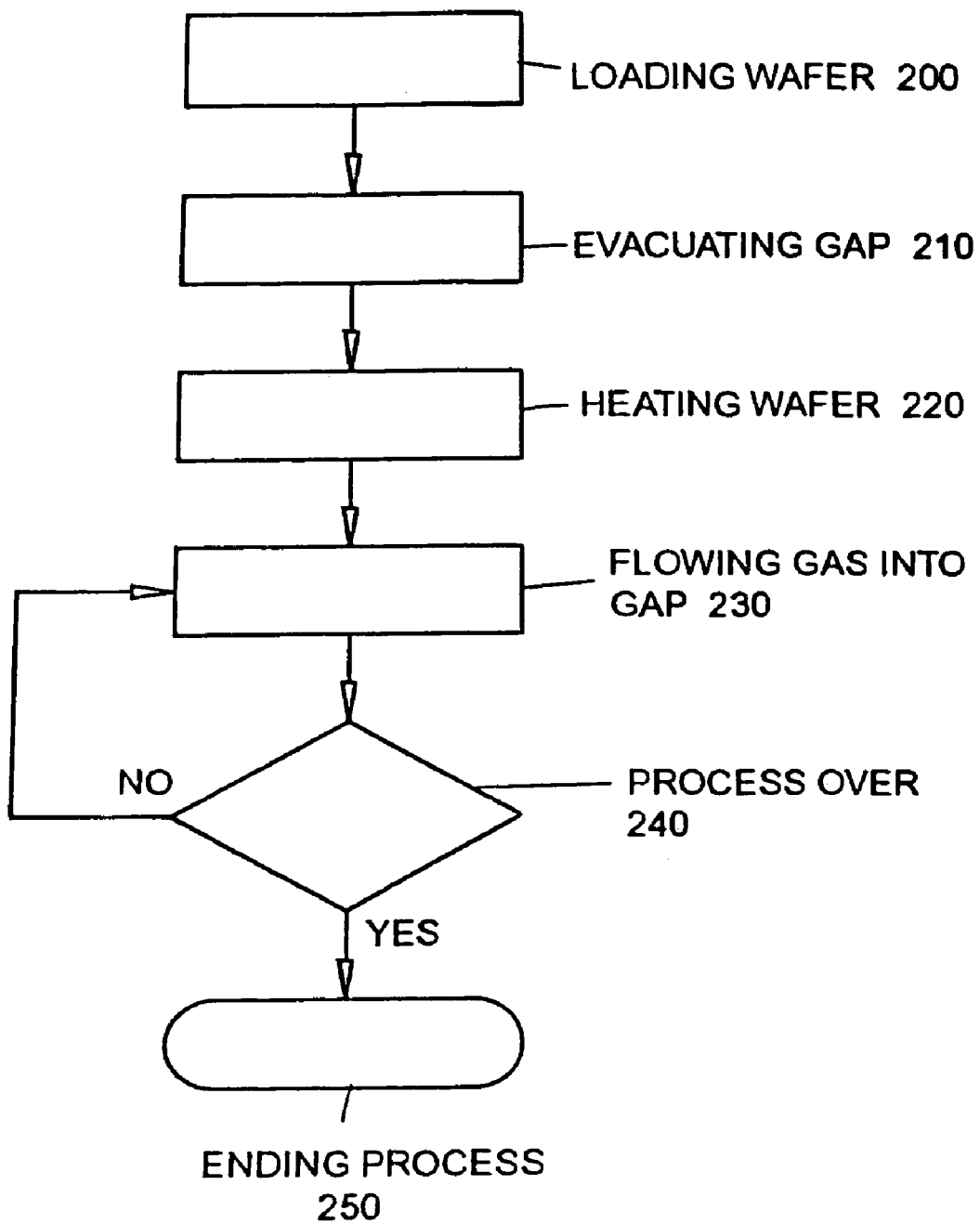
FIG. 9 is a flow diagram of a method of operation according to an embodiment of the present invention.

FIG. 9 is a flow chart setting forth a first method of operation that can be used with the first embodiment of the rapid thermal processing assembly 100.

In step 200, the substrate 108 is loaded onto the susceptor. The processing assembly is preferably configured to accommodate the passage of three lift pins (not shown) through the assembly in order to (1) lower the wafer to make contact with the susceptor during loading and (2) raise the wafer above the susceptor during unloading. The processing environment is established and the wafer is exposed to the environment (e.g., gas, pressure, etc.). During step 210 the gap recess 111 is evacuated until a prescribed pressure has been reached, or alternatively for a prescribed amount of time. In fact, step 210 can be accomplished during step 200.

In step 220, the substrate 108 is heated to a desired temperature by the controller 156 sending a signal to the power supply 157 to deliver electrical energy to the electrical resistive elements 110 via heater wires 194. With the substrate 108 on the heating assembly 102 of the rapid thermal processing assembly 100, a command from the controller 156 causes the second valve 130 to be opened to vacuum pump 126, and the first valve 128 to be opened. As a result, any residual gas in the vacuum feed 138 and in the gap recess 111 is pumped out.

In step 230, the controller 156 closes the first valve 128, sets the second valve 130 to the working fluid setting, and sets the pressure regulator 134 to allow a predetermined flow rate of working fluid from the helium gas supply 136. The pressure regulator 134 will set the pressure of the working fluid delivered to the gap recess 111. In an alternate embodiment, high pressure (i.e. atmospheric pressure) working fluid can be caused to flow through an inlet to the gap recess and exhaust the working fluid through an outlet in order to conductively-convectively cool the wafer or backside of the heating plate or heating assembly.

In step 240, the process status is queried to determine whether or not the process is over. If the process is determined as not being over, then the process loops back to step 230 and the working fluid continues to flow or maintain a specified gas pressure in the gap. If the process is determined to be over, then the process ends in step 250.

Figure 10:
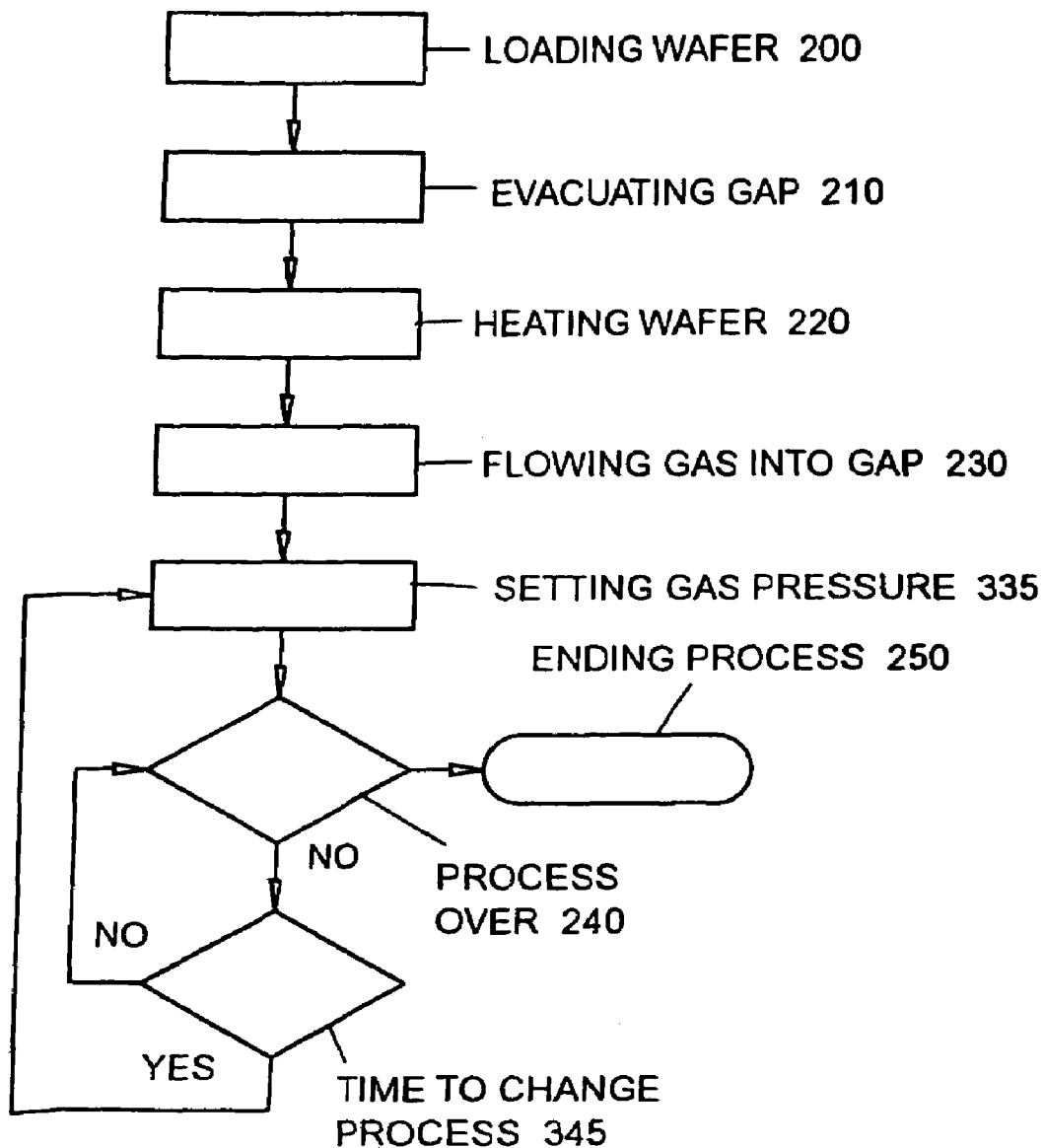
FIG. 10 is a flow diagram of a method of operation according to an alternative embodiment of the present invention.

The apparatus of the present invention is capable of more complex processes than simply heating a wafer. FIG. 10 is a flow chart showing a second method of operation that allows for different wafer temperatures in each of multiple process steps. The method extends the first method of operation, and includes the modifications as discussed below.

In step 335, the settings for the gas pressure regulator are read from memory in the controller 156, and the controller 156 sends a command to the pressure regulator 134 to set the working fluid flow from helium gas supply to the appropriate level to achieve a desired working fluid pressure. If the recipe in the memory in the controller 156 also indicates a change in power to be applied to the electrical heating elements 110, then the controller 156 sends an instruction to the power supply 157, which subsequently adjusts the amount of electrical power delivered to the electrical resistance heaters 110 via heater wires 194. Furthermore, if need be (as indicated by the process recipe), the controller 156 can turn the pressure regulator 134 off, turn the second valve 130 to the vacuum pump 126, and open up the first valve 128.

Later, if step 240 determines that the process is not over, then the process proceeds to a determination of whether it is time to change the process in step 345. In step 345, if it is determined to be time to change the process, then the new process settings are loaded into the memory and the process loops back to step 335 and the process proceeds from step 335 as described above. Once the process reaches step 250, the process ends.

In the second method of operation, once a wafer is loaded onto the rapid thermal processing assembly 100, the controller 156 accesses a process recipe in the memory. The recipe includes a sequence of steps as described above. For each step, there is a configuration for the first valve 128, the second valve 130, the pressure regulator 134, the vacuum pump 126, and the power supply 157. Further associated with each step is a time during which a given set of valve settings, power supply settings, etc. are applied. In operation, the controller 156 steps sequentially through each step in turn, executing the process instructions in each step as indicated by the recipe.

It should be clear to those skilled in the art that variations in the sequence of heating and cooling, as well as variations in the valve settings and gas flow conditions are possible.

Such variations can be used advantageously to control the rate at which wafers or other substrates reach desired process temperatures.

Generally speaking, the method for reducing thermal burden on a wafer during processing of the present invention includes the steps of heating the wafer to a predetermined temperature when needed using a heating assembly, cooling the wafer to the predetermined temperature when needed using a cooling assembly located such that a thermal conductance region is provided between the heating assembly and the cooling assembly, and adjusting a thermal conductance of the thermal conductance region to aid in heating and cooling of the wafer. Preferably, the controller 156 controls the process, and adjusts the temperature of the substrate 108 as described above to achieve the desired temperature for the substrate 108.

The method preferably provides for the step of heating the wafer by utilizing an electrical resistive element 110 attached to a heating body 196 adapted to support the substrate 108. The step of cooling the wafer preferably includes feeding a cooling fluid along a fluid path, such as coolant channel 112, within the cooling assembly 106.

The step of adjusting the thermal conductance of the thermal conductance region includes the steps of providing a body within the thermal conductance region, where the body has a recess configured to define at least a portion of a chamber configured to receive a working fluid, and adjusting a pressure or density of working fluid present within the chamber, for example, using the first embodiment of the apparatus of the present invention as depicted in FIGS. 1-8. The step of adjusting the pressure or density of working fluid present within the chamber preferably includes the step of evacuating the working fluid from the chamber during the step of heating the wafer and injecting the working fluid within the chamber during the step of cooling the wafer. Alternatively, the step of adjusting the pressure or density of the working fluid present within the chamber includes the step of injecting a first working fluid within the chamber during the step of heating the wafer and injecting a second working fluid within the chamber during the step of cooling the wafer. The step of providing a body within the thermal conductance region preferably includes the step of providing a membrane within the recess, the membrane defining separate sections within the chamber. Furthermore, the step of adjusting a pressure or density of working fluid present within the chamber preferably includes the step of providing a separate working fluid within each of the separate sections of the chamber. Alternatively, the step of providing a body within the thermal conductance region includes providing a body with a recess that has a side wall and a base, the side wall abutting the heating assembly such that the heating assembly, the side wall, and the base define the chamber, where the base is spaced apart from the heating assembly by a gap distance, and the base is configured such that the gap distance varies over the base, such as depicted in FIGS. 7 and 8.

It should be noted that the structure of the embodiments of the present invention set forth herein have the potential for vacuum and gas leaks. However, the implementation of a good configuration and careful plumbing will minimize the risk of leaks. Additionally, the vacuum integrity of parts that are bonded together is important to the effective implementation of the present invention. However, careful attention to such issues during assembly will minimize this potential problem.

One operability issue for the present invention is difficulty in controlling the actual height of gap recess 111 if it is less than approximately 25 μm. This condition would affect the repeatability of temperature control. However, in most applications, the height of gap recess 111 is likely to be much greater than 25 μm.

It should be noted that the exemplary embodiments depicted and described herein set forth the preferred embodiments of the present invention, and are not meant to limit the scope of the claims hereto in any way. Numerous modifications and variations of the present invention are possible in light of the above teachings. It is therefore to be understood that, within the scope of the appended claims, the invention may be practiced otherwise than as specifically described herein.

The invention claimed is:

1. A thermal processing apparatus comprising:
a heating assembly adapted to support a wafer for processing;
a cooling assembly located such that a thermal conductance region is provided between said heating assembly and said cooling assembly; and
a device configured to adjust a thermal conductance of said thermal conductance region, said device located between said heating assembly and said cooling assembly;
wherein said device comprises a body having a recess configured to define at least a portion of a chamber configured to receive a working fluid, and a fluid injection system configured to inject a working fluid within said chamber, and a control system configured to control said fluid injection system to achieve at least one of a predetermined density and a predetermined pressure of working fluid within said chamber, and said device includes a pressure regulator, said control system being configured to control said pressure regulator, said chamber including a membrane therein defining separate sections within said chamber.

2. A thermal processing apparatus comprising:
a heating assembly adapted to support a wafer for processing;
a cooling assembly located such that a thermal conductance region is provided between said heating assembly and said cooling assembly; and
a device configured to adjust a thermal conductance of said thermal conductance region, said device located between said heating assembly and said cooling assembly, said device comprising a body having a recess configured to define at least a portion of a chamber configured to receive a working fluid, said chamber including a membrane therein defining separate sections within said chamber, wherein at least one of said heating assembly and said cooling assembly comprises at least one of quartz, alumina, sapphire, aluminum, carbon, silicon carbide, and silicon nitride.

3. A thermal processing apparatus comprising:
a heating assembly adapted to support a wafer for processing;
a cooling assembly located such that a thermal conductance region is provided between said heating assembly and said cooling assembly; and
a device configured to adjust a thermal conductance of said thermal conductance region, said device located between said heating assembly and said cooling assembly, said device comprising a body having a recess configured to define at least a portion of a chamber configured to receive a working fluid, said chamber having a platinum coating on an inner surface thereof, wherein said heating assembly comprises aluminum.

4. A thermal processing apparatus comprising:

a heating assembly adapted to support a wafer for processing;

a cooling assembly located such that a thermal conductance region is provided between said heating assembly and said cooling assembly; and means for adjusting a thermal conductance of said thermal conductance region, said means for adjusting located between said heating assembly and said cooling assembly, wherein said means for adjusting the thermal conductance of said thermal conductance region comprises a body having a recess configured to define at least a portion of a chamber configured to receive a working fluid, and means for adjusting at least one of a pressure and a density of working fluid present within said chamber, said chamber including a membrane therein defining separate sections within said chamber.

5. A thermal processing apparatus comprising:

a heating assembly adapted to support a wafer for processing;

a cooling assembly located such that a thermal conductance region is provided between said heating assembly and said cooling assembly; and means for adjusting a thermal conductance of said thermal conductance region, said means for adjusting located between said heating assembly and said cooling assembly, said means for adjusting comprising a body having a recess configured to define at least a portion of a chamber configured to receive a working fluid, said chamber having a platinum coating on an inner surface thereof, wherein at least one of said heating assembly and said cooling assembly comprises at least one of quartz, alumina, sapphire, aluminum, carbon, silicon carbide, and silicon nitride.

6. A thermal processing apparatus comprising:

a cooling assembly adapted to support a wafer for processing;

a heating assembly located such that a thermal conductance region is provided between said heating assembly and said cooling assembly; and a device configured to adjust a thermal conductance of said thermal conductance region, said device located between said heating assembly and said cooling assembly, said device comprising a body having a recess configured to define at least a portion of a chamber configured to receive a working fluid, said chamber including a membrane therein defining separate sections within said chamber, wherein at least one of said heating assembly and said cooling assembly comprises at least one of quartz, alumina, sapphire, aluminum, carbon, silicon carbide, and silicon nitride.

7. A thermal processing apparatus comprising:

a cooling assembly adapted to support a wafer for processing;

a heating assembly located such that a thermal conductance region is provided between said heating assembly and said cooling assembly; and means for adjusting a thermal conductance of said thermal conductance region, said means for adjusting located between said heating assembly and said cooling assembly, wherein said means for adjusting the thermal conductance of said thermal conductance region comprises a body having a recess configured to define at least a portion of a chamber configured to receive a working fluid, said chamber having a platinum coating on an inner surface thereof, and means for adjusting at least one of a pressure and a density of working fluid present within said chamber.

* * * * *